United States Patent
Thompson et al.

(10) Patent No.: US 8,786,179 B2
(45) Date of Patent: Jul. 22, 2014

(54) LIGHT EMITTING DEVICE COMPRISING PHOSPHORESCENT MATERIALS FOR WHITE LIGHT GENERATION

(71) Applicant: Universal Display Corporation, Ewing, NJ (US)

(72) Inventors: Mark E. Thompson, Anaheim, CA (US); P. Daniel Dapkus, Fullerton, CA (US)

(73) Assignee: Universal Display Corporation, Ewing, NJ (US)

(*) Notice: Subject to any disclaimer, the term of this patent is extended or adjusted under 35 U.S.C. 154(b) by 0 days.

(21) Appl. No.: 13/621,739

(22) Filed: Sep. 17, 2012

(65) Prior Publication Data

US 2014/0077689 A1   Mar. 20, 2014

(51) Int. Cl.
*H01L 51/00* (2006.01)

(52) U.S. Cl.
USPC ............................................. 313/504; 445/24

(58) Field of Classification Search
USPC ................. 313/504–512; 445/24–25
See application file for complete search history.

(56) References Cited

U.S. PATENT DOCUMENTS

| | | | |
|---|---|---|---|
| 7,374,807 B2 * | 5/2008 | Parce et al. | 428/76 |
| 2008/0258606 A1 * | 10/2008 | Butler et al. | 313/504 |

FOREIGN PATENT DOCUMENTS

| | | |
|---|---|---|
| WO | 00/70655 | 11/2000 |
| WO | 03/059015 A1 | 7/2003 |
| WO | 2011063083 | 5/2011 |

OTHER PUBLICATIONS

Adamovich, Vadim, et al., High efficiency single dopant white electrophosphorescent light emitting diodes, New J. Chem., 2002, 26, 1171-1178.
Krylova, Valentina A. et al., Synthesis and characterization of phosphorescent three-coordinate Cu(I)—NHC complexes, Chem. Commun., 2010, 46, 6696-6698.
Liu, Zhiwei, et al., Cu4I4 Clusters Supported by P^N-type Ligands: New Structures with Tunabe Emission Colors, Dec. 1, 2011.
Shoustikov, Andrei A., et al., Electroluminescence Color Tuning by Dye Doping in Organic Light-Emitting Diodes, IEEE Journal of Selected Topics in Quantum Electronics, vol. 4, No. 1, Jan./Feb. 1998.
Thompson, M.E., et al., OLED Efficiency and Chromaticity: Units, Organometallic Complexes for Optoelectronic Applications, Chapter 12.04.2.2, 2007.
Thompson, M.E., et al. Organometallic Complexes for Optoelectronic Applications, Chapter 12.04, 2007.

* cited by examiner

*Primary Examiner* — Anne Hines
(74) *Attorney, Agent, or Firm* — Pillsbury Winthrop Shaw Pittman LLP

(57) ABSTRACT

The present invention relates to phosphors for energy down-conversion of high energy light to generate a broadband light spectrum, which emit light of different emission wavelengths.

25 Claims, 12 Drawing Sheets

1　　　　　2　　　　　3　　　　　4

US 8,786,179 B2

LIGHT EMITTING DEVICE COMPRISING PHOSPHORESCENT MATERIALS FOR WHITE LIGHT GENERATION

GOVERNMENT SUPPORT

This work was supported in part by Grants de-sc0001013 the Department of Energy-Energy Frontier Research Center (DoE-EFRC). The government has certain rights in the invention.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to phosphors for energy downconversion of high energy light to generate a broadband light spectrum, which emit light of different emission wavelengths. In particular, the present invention relates to metal-organic and orgnanometallic phosphors. These phosphors capable of energy downcoversion are useful materials in Light emitting devices (LEDs).

BACKGROUND

Light emitting diodes (LEDs) are emerging as the superior technology for lighting applications, offering energy efficient, eco friendly, robust and long-lasting alternative to traditional incandescent and fluorescent lamps. In view of global attention to energy saving the long term goal is to replace the conventional light sources with LEDs. This requires further major improvements such as cost reduction and enhanced light quality.

A common approach to white light generation is the downconversion of high energy light, for example, from the UV, violet or blue end of the electromagnetic spectrum, into broadband visible light. Such an approach is used in fluorescent light sources, in both tube and compact fluorescent devices, as well as many white LEDs. The downconverting materials that are commonly used for this purpose includes mixtures of rare earth materials. Typically, these rare earth materials have high efficiencies in converting UV or violet light into visible light, and are thermally and chemically stable. Thus, they may withstand the harsh environments inside fluorescent sources. While these rare earth materials work well as downconverters for white light sources, they are expensive and in limited supply. Therefore, there exists a great deal of interest in seeking solutions for energy downconversion for lighting that does not involve rare earth metals.

Some of the most efficient white light emitting inorganic LEDs (iLEDs) use a downconverting strategy, similar to fluorescent tube sources to produce their broadband emission. These sources typically rely on rare earth metals for converting high energy light into a broadband (white) spectrum of emission. While it is possible to generate white light with several different LEDs running in parallel, e.g., separate red, green and blue iLEDs, this adds cost to the system and suffers from the "green gap" problem, which is associated with the observation that green LEDs show a marked drop in efficiency when they are run at high brightness. The green portion of the light produced by multiple iLEDs is produced inefficiently, thus limiting the overall system efficiency. Such drop in efficiency is smaller for UV, violet and blue emitting devices. Therefore, devices that are able to downconvert UV/violet/blue light into the visible spectrum can be run at high brightness and high efficiency. Thus, there is a need to design and employ downcoverting materials that can be efficiently excited by light from UV, violet or blue iLEDs, to generate a broad band spectrum.

SUMMARY OF THE INVENTION

The present invention provides a white light emitting device comprising an emissive layer, wherein the emissive layer comprises a molecular phosphorescent phosphor for energy downconversion to generate a broadband light spectrum, wherein the phosphor absorbs light at a first wavelength $\lambda_1$ of radiation, and emits light of different emission wavelengths having lower energies than the first wavelength $\lambda_1$.

The present invention also provides a method of generating white light comprising providing an excitation source (light source); providing a molecular phosphorescent phosphor for absorbing the light source at a first wavelength $\lambda_1$ of radiation; and emitting light of different emission wavelengths having lower energies than the first wavelength $\lambda_1$, wherein the light emitted by the phosphor from the sum of the different emission wavelengths provides an appearance of white light.

BRIEF DESCRIPTION OF THE DRAWINGS

17, R=iso-propyl; 18, R=ethyl) in solid state in accordance with the present invention.

DETAILED DESCRIPTION

Figure 1:
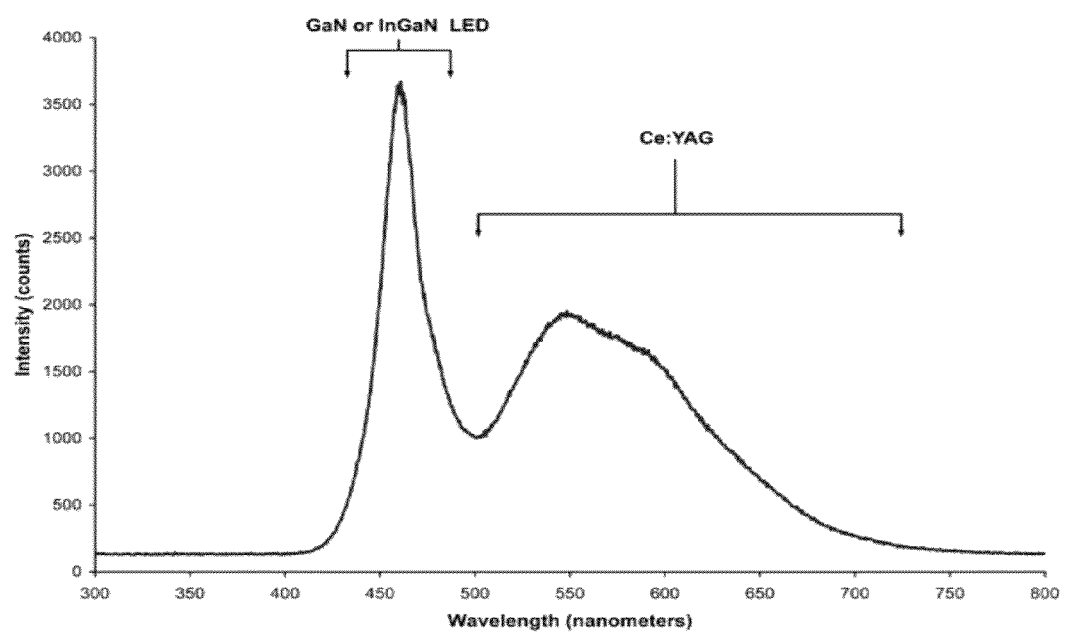
FIG. 1 shows a luminescence spectra of two excitation sources in accordance with the present invention. GaN or InGaN LED emission with a maximum at 460 nm. Ce:YAG emission covers a broad band from 500 nm to 650 nm.
Figure 2A:
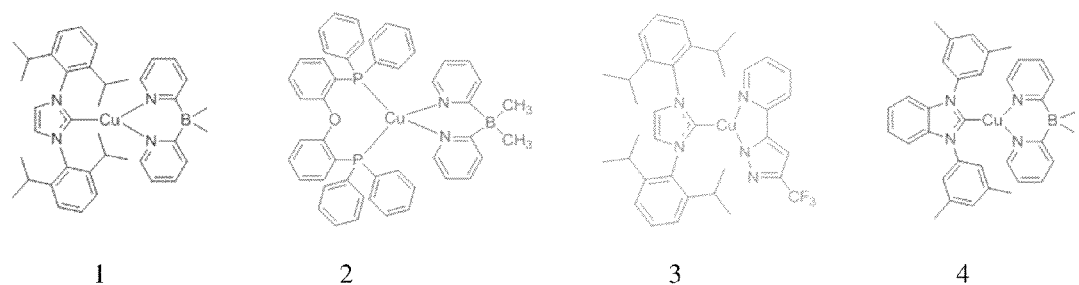
FIG. 2a shows the absorption spectra of three Cu(I)-complexes 1, 2 and 3 in $CH_2Cl_2$ solution ($C_M \approx 10^{-5}$ M) in accordance with the present invention.
Figure 2A:
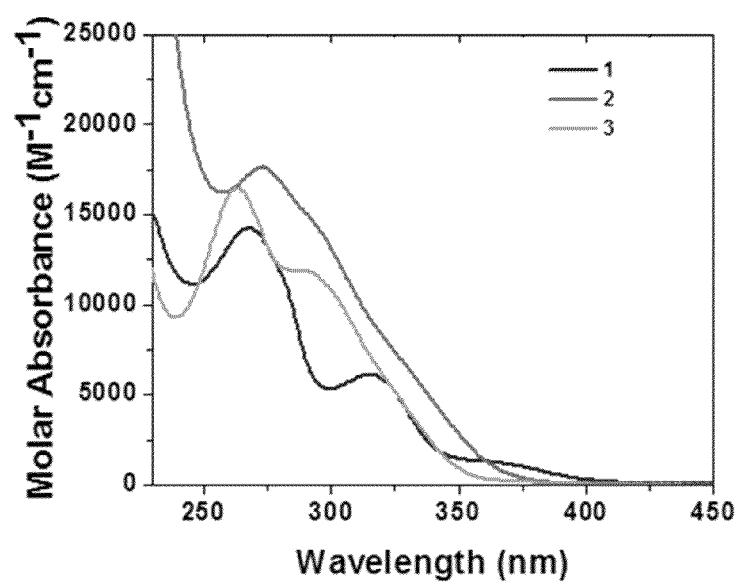
Figure 2B:
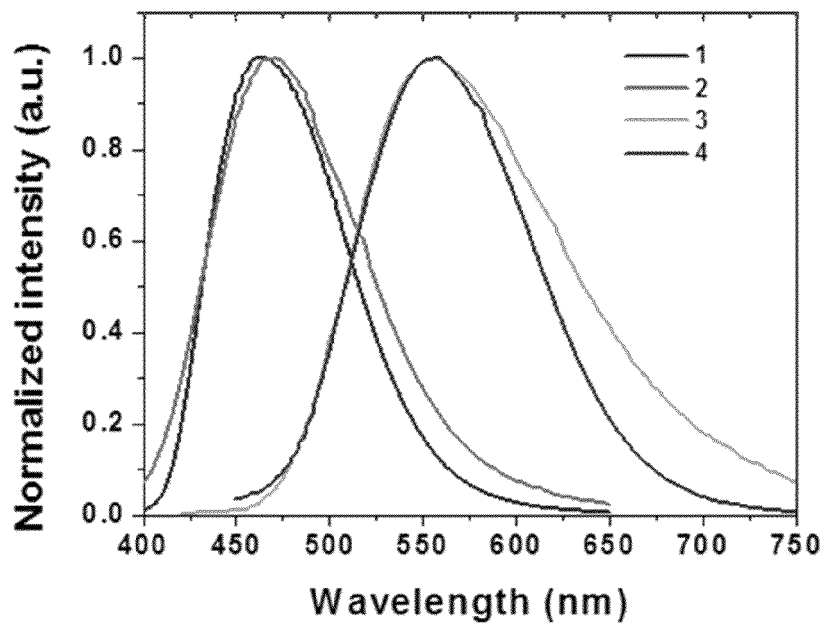
FIG. 2b shows the emission spectra of four Cu(I)-complexes 1, 2, 3 and 4 in solid state in accordance with the present invention.
Figure 2C:
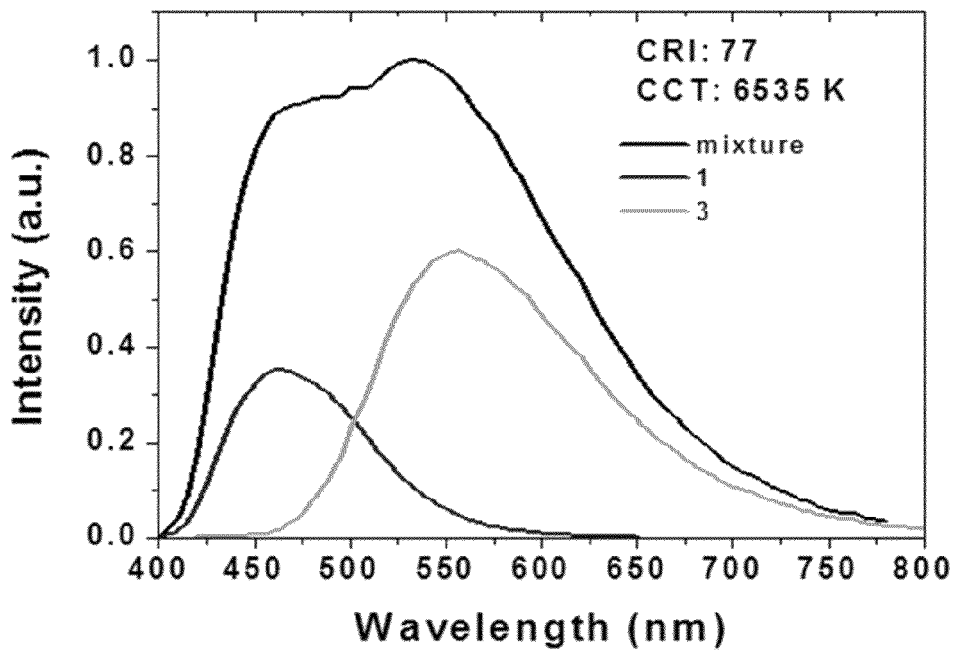
FIG. 2c shows the emission spectra of two Cu(I)-complexes 1, 3 and mixture thereof in solid state in accordance with the present invention.
Figure 3A:
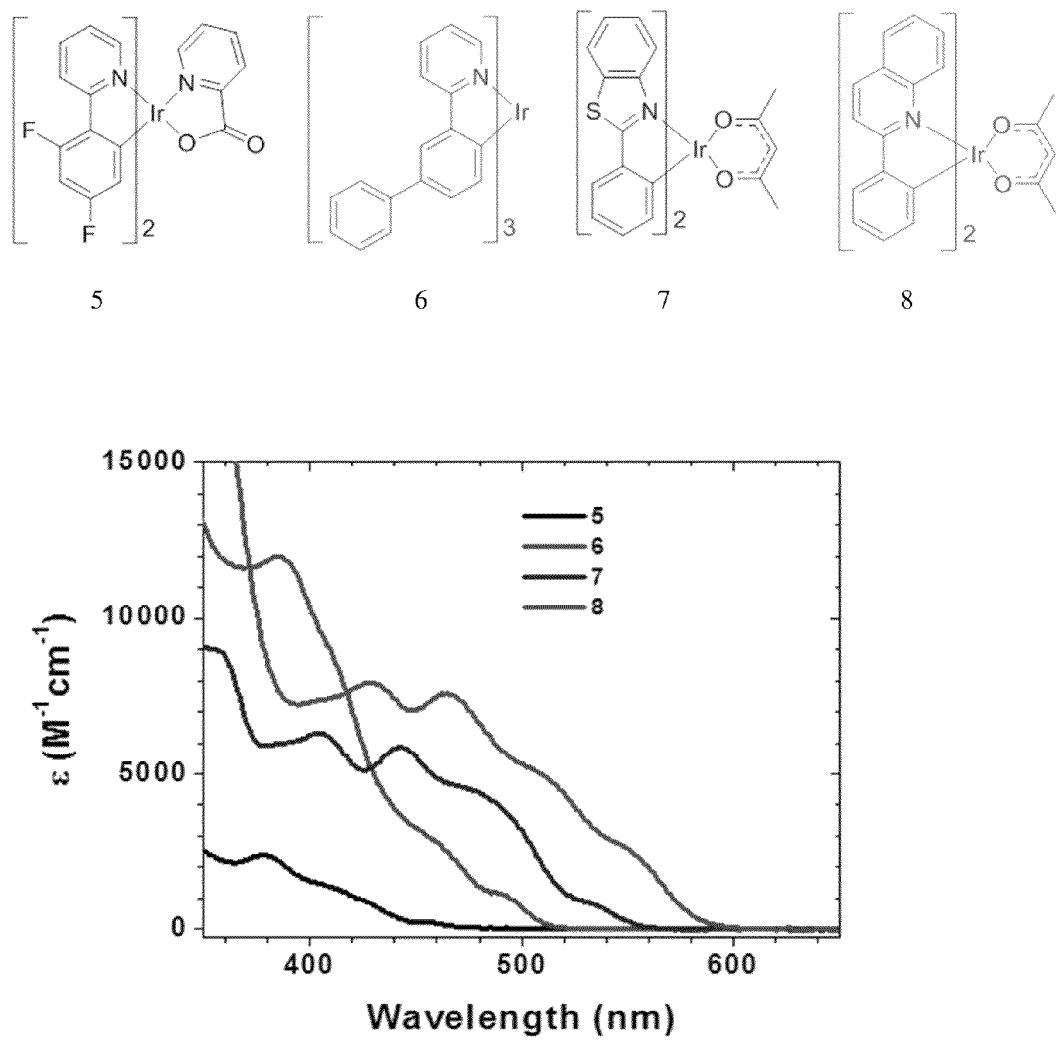
FIG. 3a shows the absorption spectra of four Ir(III)-complexes 5, 6, 7 and 8 in $CH_2Cl_2$ solution ($C_M \approx 10^{-5}$ M) in accordance with the present invention.
Figure 3B:
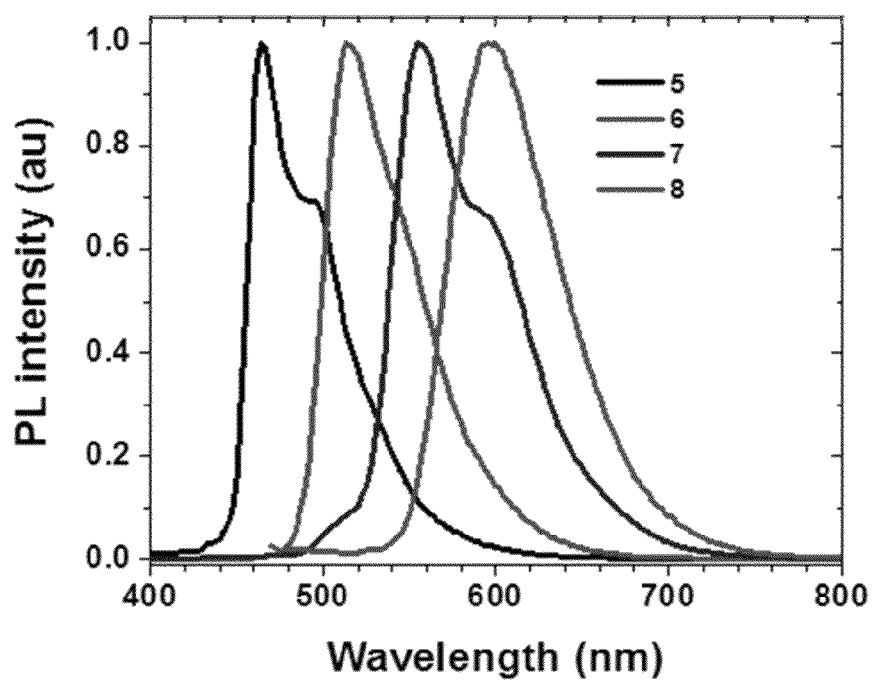
FIG. 3b shows the emission spectra of four Ir(III)-complexes 5, 6, 7 and 8 in solid state in accordance with the present invention.
Figure 3C:
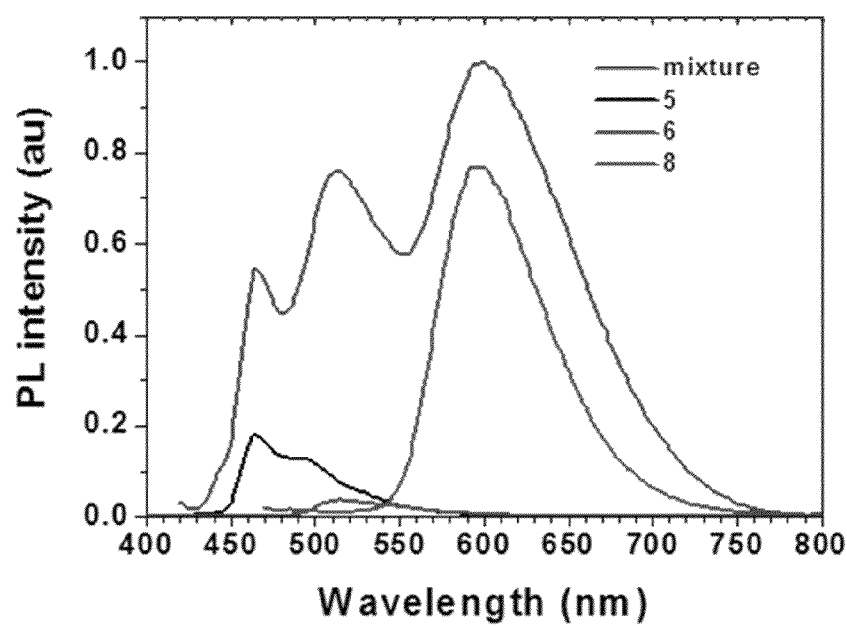
FIG. 3c shows the emission spectra of three Ir(III)-complexes 5, 6, 8 and mixture thereof in solid state in accordance with the present invention.

The present invention is directed to producing efficient white emitting light emitting devices (LEDs). The device employs a phosphor that absorbs energy from an excitation source in the blue, violet, or ultra violet region, and emits energy in the visible region at multiple wavelengths. The sum of the multiple emission wavelengths gives broad band (white emission) and produces an appearance of white light. Thus, the light emitted by the phosphor from the sum of the different emission wavelengths contributes to the results in the appearance of white light. The excitation source may or may not contribute to the total spectrum and produce white light.

In certain embodiments, the white LED of the present invention has luminous efficacy of radiation (LER) in excess of 50 lm/W.

The phosphor of the present invention refers to a molecular phosphor, which is a non-atomic emitter. For example, the phosphor of the present invention is not a lanthanide (atomic emitter).

The phosphor of the present invention may comprise multiple phosphors or a single phosphor.

Multiple Phosphors

In certain embodiments, the phosphor comprises two or more phosphors, such as a first phosphor, a second phosphor, and so forth. In certain embodiments, the phosphor comprises two phosphors, e.g., a first phosphor and a second phosphor. In certain embodiments, the phosphor comprises three phosphors, e.g., a first phosphor, a second phosphor and a third phosphor. In certain embodiments, the phosphor comprises four phosphors, e.g., a first phosphor, a second phosphor, a third phosphor, and a forth phosphor.

Suitable phosphor molecules may include metal complexes, such as copper and iridium complexes. These phosphor molecules are attractive materials for wavelength down-converters for white LEDs due to their broad-band absorption and emission and high phosphorescent quantum yields. Their photophysical properties can be fine-tuned to achieve high performance and to fulfill requirements for specific lighting applications. Other suitable phosphor molecules may include organic materials that provides good phosphorescent efficiency and do not substantially absorb their own emission. Halogenated organic compounds, such as those containing bromine or iodine, promote intersystem crossing to the triplet excited state.

Certain examples of suitable organometallic copper complexes are described in WO 20011/063083, which is incorporated herein by reference in its entirety.

In certain embodiments, the organometallic copper complex includes a carbine ligand coordinated to a three coordinate copper atom.

In one aspect, the carbene ligand has the formula:

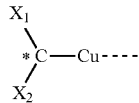

Formula I, wherein *C is a divalent carbon atom coordinated to a monovalent copper atom Cu. X$_1$ and X$_2$ are substituents independently selected from alkyl, amine, phosphine, heteroalkyl, aryl and heteroaryl. X$_1$ and X$_2$ may be further substituted, and X$_1$ and X$_2$ are optionally linked to form a cycle. In one aspect, the carbene ligand is monodentate. In certain embodiments, each of X$_1$ and X$_2$ independently forms a bond with *C. A first bond is formed between *C and an atom X'$_1$ in substituent X$_1$, and a second bond is formed between *C and an atom X'$_2$ in substituent X$_2$. X'$_1$ and X'$_2$ are independently selected from the group consisting of C, N, O, S and P. In another aspect, the carbene ligand is monodentate. In one aspect, X$_1$ and X$_2$ are not joined to form a cycle. In another aspect, X$_1$ and X$_2$ are joined to form a cycle. In one aspect, the copper complex is neutral. In another aspect, the copper complex is charged.

In one aspect, the complex has the formula:

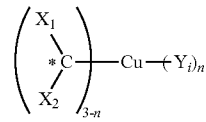

Formula II, wherein Yi is independently selected from the group consisting of alkyl, alkoxy, amino, alkenyl, alkynyl, arylalkyl, heteroalkyl, aryl and heteroaryl. Yi is a monodentate ligand or a bidentate ligand. n is 1 or 2.

In another aspect, the complex has the formula:

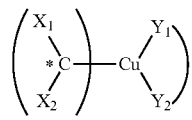

Formula III, wherein Y$_1$ and Y$_2$ are substituents that are independently selected from the group consisting of alkyl, heteroalkyl, aryl and heteroaryl. Y$_1$ and Y$_2$ may be further substituted. Y$_1$ and Y$_2$ are joined. Each of Y$_1$ and Y$_2$ form a bond with Cu. A first bond is formed between Cu and an atom Y'$_1$ in substituent Y$_1$ and a second bond is formed between Cu and an atom Y'$_2$ in substituent Y$_2$. Y'$_1$ is selected from the group consisting of N, P, *C, O, and S. Y'$_2$ is selected from the group consisting of N, P, *C, tetravalent carbon, O, and S. In certain embodiments, Y'$_1$ is N. In certain embodiments, the ring comprising Cu, Y'$_1$ and Y'$_2$ is a 5-membered or 6-membered ring Certain examples of suitable organometallic iridium complexes are described in WO 00/70655 and Organometallic Complexes for Optoelectronic Applications, Chapter 12.04, M. E. Thompson et al., which are incorporated herein by reference in its entirety. Non-limiting examples of the organometallic iridium complexes includes the following:

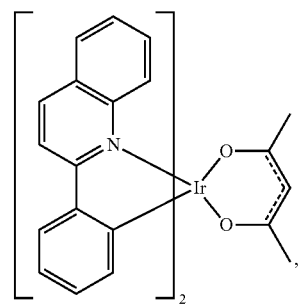

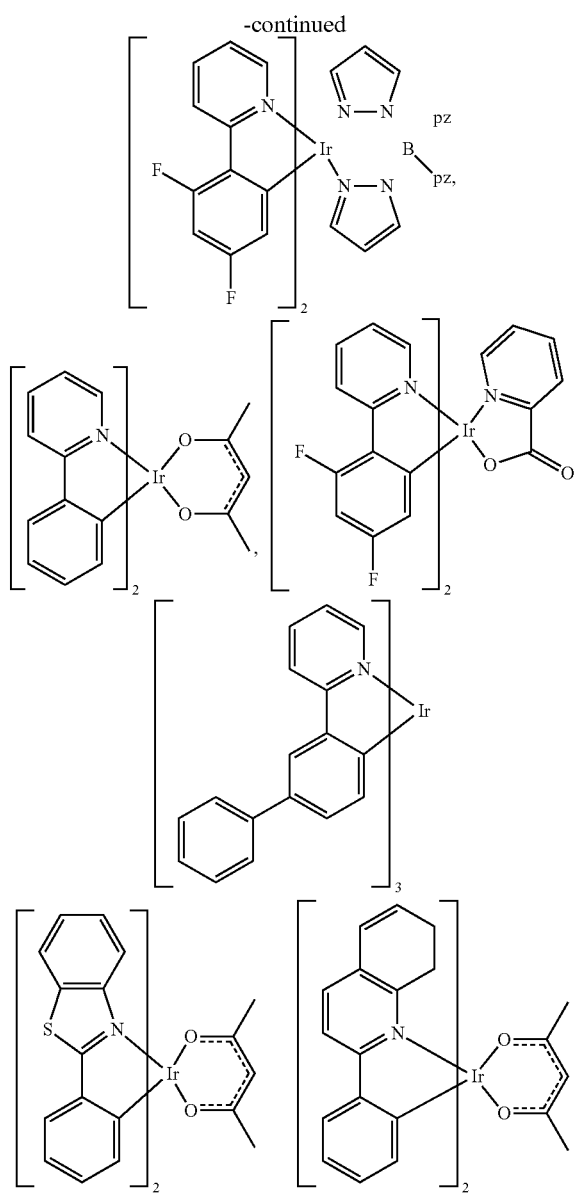

The phosphor may include two or more phosphors chosen from the same type or different types of compounds. For example, the phosphor may include a mixture of organometallic copper complexes (e.g., two or more different organometallic copper complexes), or the phosphor may include a mixture of organometallic iridium compounds (e.g., two or more different organometallic iridium complexes), or the phosphor may include an organometallic copper complex, an organometallic iridium compound, or the phosphor may include a mixture of organometallic copper complexes and an organometallic iridium compound, etc.

Single Phosphor

In certain embodiments, the phosphor comprises a single phosphor. The single phosphor emits simultaneously from molecular and aggregate states. When the single phosphor emits from the molecular state, a molecular/monomer emitter is referred to, which comprises a monomer. When the single phosphor emits from the aggregate state, an aggregate emitter is referred to, which comprises two molecules (i.e., dimer). Thus, the phosphor of the present invention may comprise a first phosphor being a molecular emitter, and a second phosphor being an aggregate emitter. In this scenario, both monomer and aggregate emission are achieved from the same phosphor. When the phosphor molecules are in relatively close contact with one another, aggregate emission may be produced. When the phosphor molecules are isolated from one another, monomer emission (i.e., not aggregate emission) may be produced. White emission may result, if the relative contribution from each emissive center (i.e., monomer emission/aggregate emission) is appropriately controlled, for example, by adjusting the concentration of each emitter. To achieve well balanced monomer and aggregate emission with a single phosphor and achieve high efficiencies the monomer-aggregate ratio must be achieved at an appropriate concentration of the phosphor. Different approaches that affect the nature of intermolecular interactions in the matrix, and thus the degree of monomer-aggregate emission may be used to control the monomer-aggregate emission ratio. One such approach is to vary the amount of steric bulk in the phosphor molecule. An alternative approach is to change the host matrix. Both approaches are believed to affect the degree of association of the dopant material in the emissive layer and hence the ratio of monomer and aggregate states.

Generally, the monomer emitter of the single phosphor emits in the high energy (e.g., blue or green) portion of the visible spectrum, while the aggregate emitter provides a broad emission which spans the low energy portion of the visible spectrum. Typically, there is no absorption into the aggregate emitters, thus there is minimal or no energy transfer from the monomer emitter to the aggregate emitters.

At appropriate concentrations, both monomer and aggregate emission may be obtained from the same phosphor. Only those phosphor molecules that are in relatively close contact with another phosphor molecule will be able to form the aggregate state. Phosphor molecules that are isolated will give monomer and not aggregate emission. If the monomer is blue emitting and the aggregate is yellow emitting, a white OLED may result, if the relative contribution from each emitter is appropriately controlled, for example, by adjusting the concentration of each emitter in the emissive layer.

Forming aggregate states requires that the two phosphor molecules be in close proximity to each other, so that they can dimerize when one of them is promoted to its excited state. This suggests that there should be a strong concentration dependence in aggregate formation. A monomer emission may be observed in the photoluminescence spectrum of the thin film at a low doping level, typically less than 2%. As the doping concentration is raised, the amount of aggregate emission increases as the monomer line decreases. The ratio of monomer to aggregate emission may be close to 1:1 at a higher doping level. The appropriate doping level to achieve balanced monomer and aggregate emission to give a broadband white emission depends on the steric constraints of the emitter. A sterically encumbered emitter will require a higher doping level to achieve balanced emission than an emitter without sterically demanding groups. Emitters with a minimal amount of steric bulk can be designed to give balanced emission at a doping level of 8-10% dopant relative to host. At such doping level, some of the phosphor molecules are isolated and others are in close proximity to another phosphor molecule, leading to efficient aggregate formation.

The monomer and aggregate emitters are described in WO 03/059015 A1, which is incorporated herein in its entirety. Examples of phosphors that are capable to produce monomer and aggregate emitters include organometallic transition metal complexes that have a square planar geometry and have ligands of sufficient steric bulk to hinder aggregate formation.

The phosphor may absorbs light at a first wavelength $\lambda_1$ in the range of 300 nm to 450 nm or in the range of 300 nm and 400 nm. Upon absorption of light at the first wavelength $\lambda_1$, the phosphor is promoted to a triplet state, $T_1$. Typically, the phosphor is first promoted from the ground state, $S_0$, to the lowest-energy singlet excited state, $S_1$, which then decay undergo intersystem cross (ISC) to the triplet state. The phosphor emits from triplet states and generates triplet excitons. Thus, the phosphor of the present invention is a phosphorescent emitter, and is not a fluorescent emitter. The phosphors of the present invention absorb only from the excitation source (i.e., blue/violet, ultra violet light source). The phosphors of the present invention do not absorb any proportion of the excitation light generated in the visible region. Suitable excitation sources for the present invention include light sources that are produced with III-V semiconducting materials and emit a first wavelength $\lambda_1$ of light (e.g., in the blue, violet, or ultra violet region). Non-limiting examples of inorganic light emitting diodes (iLEDs) include GaN (gallium nitrile), or InGaN (indium gallium nitride), each of which may be coated with cerium-doped yttrium aluminum garnet (Ce 3+:YAG).

Figure 4:
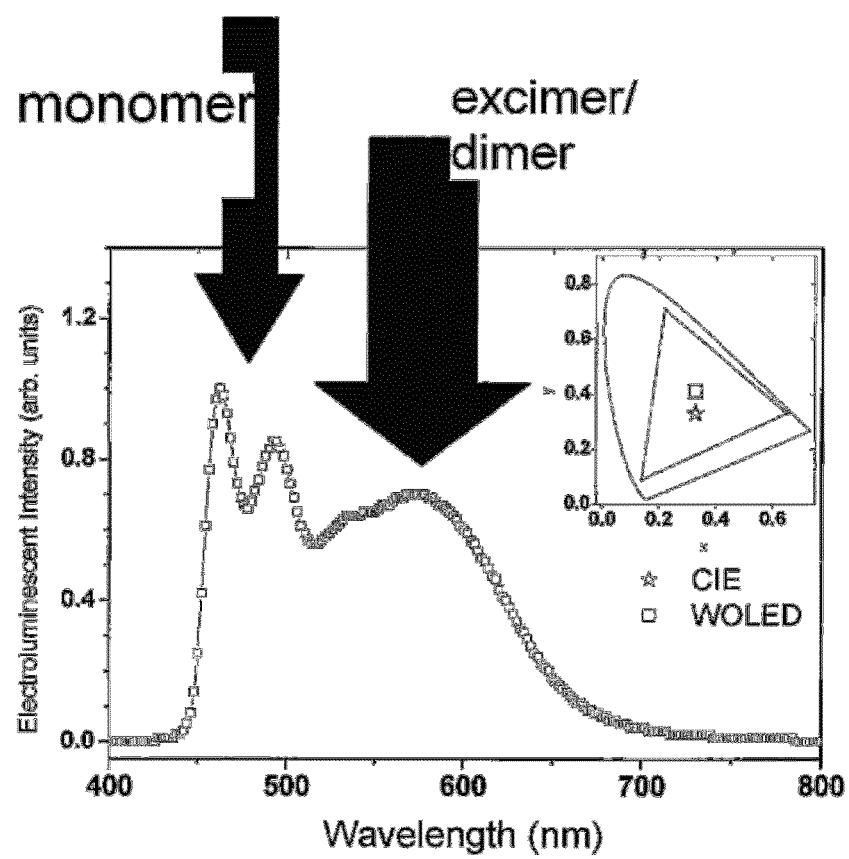
FIG. 4 shows the emission spectra of a monomer and excimer/dimer of a platinum based compound in accordance with the present invention. The CIE and WOLED (white-emitting OLED) coordinates are shown on the left side of the graph.
Figure 5A:
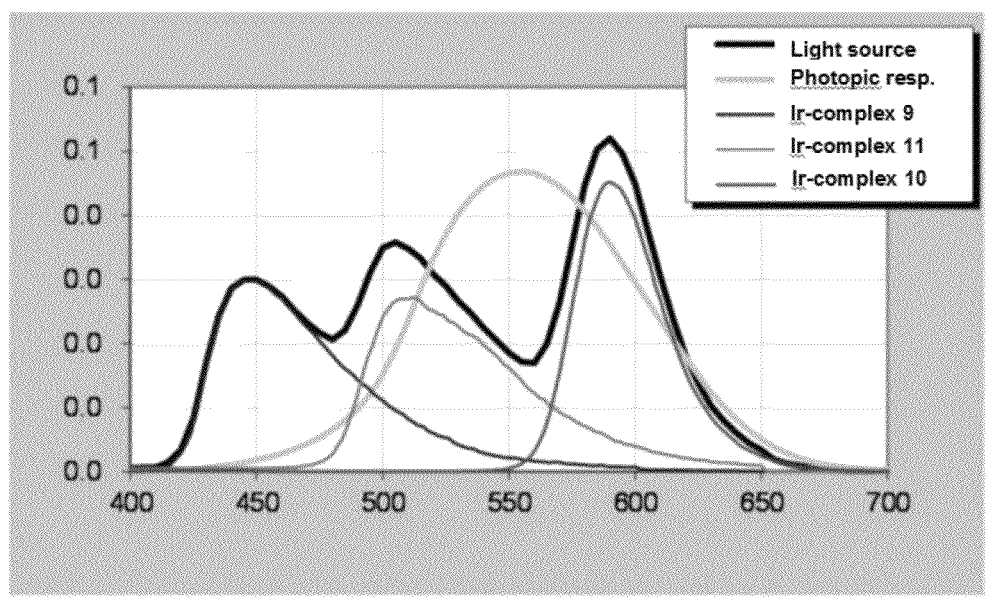
FIG. 5a shows the emission spectra of three iridium complexes 9, 10 and 11 in solid state in accordance with the present invention.
Figure 5B:
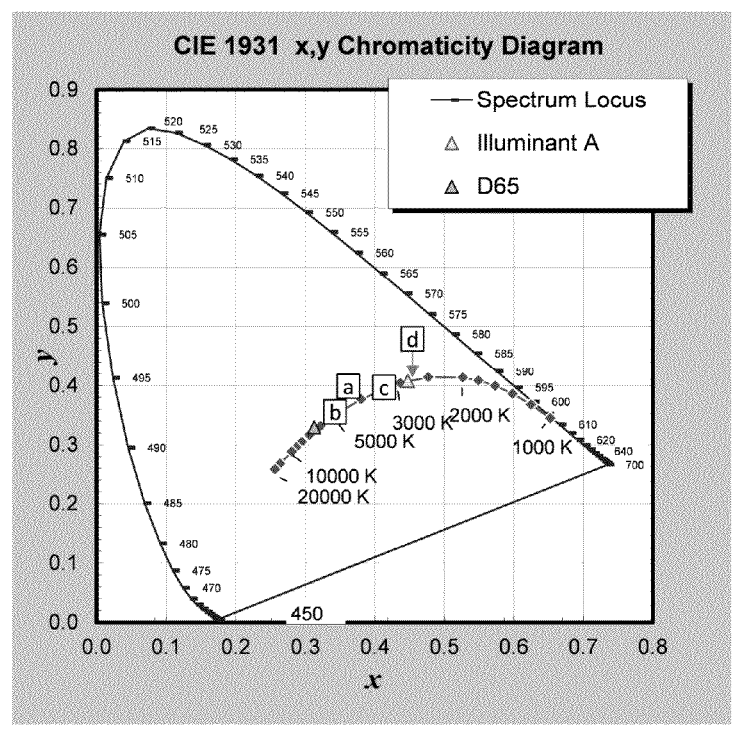
FIG. 5b shows the CIE coordinates for the mixtures of the three iridium complexes 9, 10, and 11 in accordance with the present invention.

The phosphors of the present invention may emit lights at different regions in the visible spectrum, such as, blue, green, red, orange, yellow, or mixtures thereof (e.g., blue-green, green-red, yellow-green, yellow-orange, etc.). The phosphors may emit lights at any ranges in the visible spectrum. The phosphor (including single and multiple phosphors) should together display emission covering the visible spectrum. For example, the first phosphor may emit light covering the lower wavelength region of the visible spectrum, the second phosphor may emit light covering the higher wavelength region of the visible spectrum, etc. The phosphor's emissions may or may not overlap one another's emissions. Specific ranges of emissions in the visible spectrum includes wavelengths between 400 nm and 500 nm, between 400 nm and 520 nm, between 400 nm and 540 nm, between 440 nm and 560 nm, between 450 nm and 550 nm, between 450 nm and 570 nm, between 500 nm and 600 nm, between 500 nm and 620 nm, between 500 nm and 640 nm, between 520 and 640 nm, between 520 and 660 nm, between 540 and 660 nm, between 550 nm and 650 nm, between 560 nm and 660 nm, between 560 and 680 nm, between 580 and 680 nm, between 580 and 70 nm, etc. In certain embodiments, a first phosphor may emit light at a blue-green region (i.e., at wavelength between 400 nm and 520 nm), and a second phosphor may emit light at a green-red region (i.e., at wavelength between 520 nm and 700 nm. FIGS. 4b and 5b show the emission spectra of different molecular phosphors. The combination of a molecular phosphor that emits in the shorter wavelength and a molecular phosphor that emits in the longer wavelength provide a broad band that covers a large part of the visible spectrum.

For instance, referring to FIG. 4b, the emission spectra illustrates that Cu(I)-complexes 1 and 2 emit with a similar shorter wavelength range, and Cu(I)-complexes 3 and 4 emit with a similar longer wavelength range. The summation of the emission spectra of two phosphors, one that emits with a shorter wavelength and the other that emits with a longer wavelength, may provide an overall emission spectrum that covers a large part of the visible spectrum. For example, each of the combinations of Cu(I)-complexes 1 and 3, 1 and 4, 2 and 3, and 2 and 4, emit in the range from 400 to 650 nm. FIG. 4c illustrates a simulated spectrum of a mixture of Cu(I)-complexes 1 and 3.

Referring to FIG. 5b, the emission spectra illustrates that each Ir(III)-complex emits light with a different range of wavelength. The summation of the emission spectra of any number of phosphors that emit with a different wavelength may provide an overall emission spectrum that covers a large part of the visible spectrum. For example, the combinations of Ir(III)-complexes 1, 2, 3 and 4 emit in the range from 450 to 700 nm; the combinations of Ir(III)-complexes 2 and 4 emit in the range of 450 to 700 nm; the combinations of Ir(III)-complexes 1, 2 and 4 emit in the range from 400 to 700 nm; and so forth. FIG. 5c illustrates a simulated spectrum of a mixture of Ir(III)-complexes 5, 6 and 8 in $CH_2Cl_2$ solution.

Figure 6A:
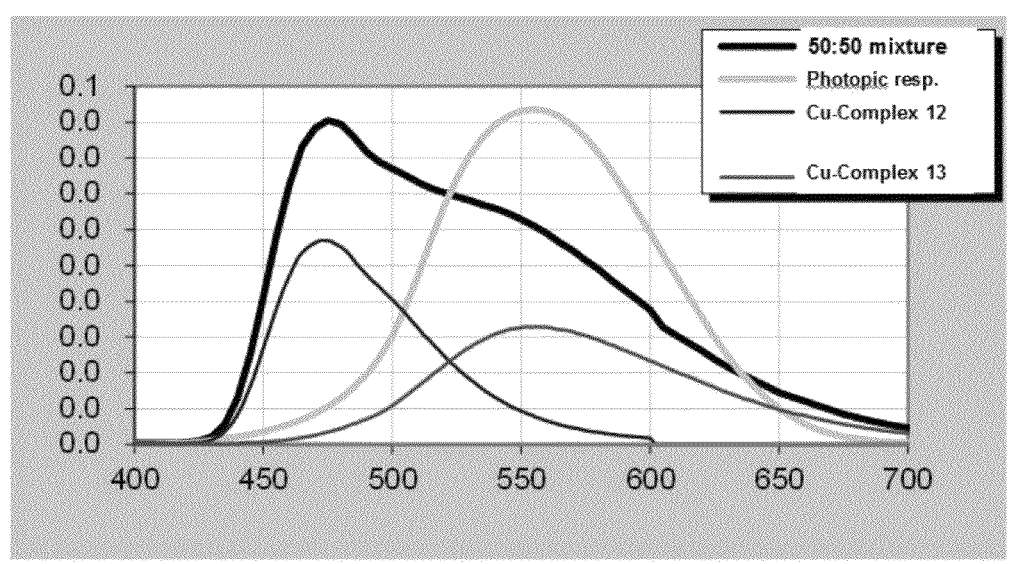
FIG. 6a shows the emission spectra of two copper complexes 12 and 13 in solid state in accordance with the present invention.
Figure 6B:
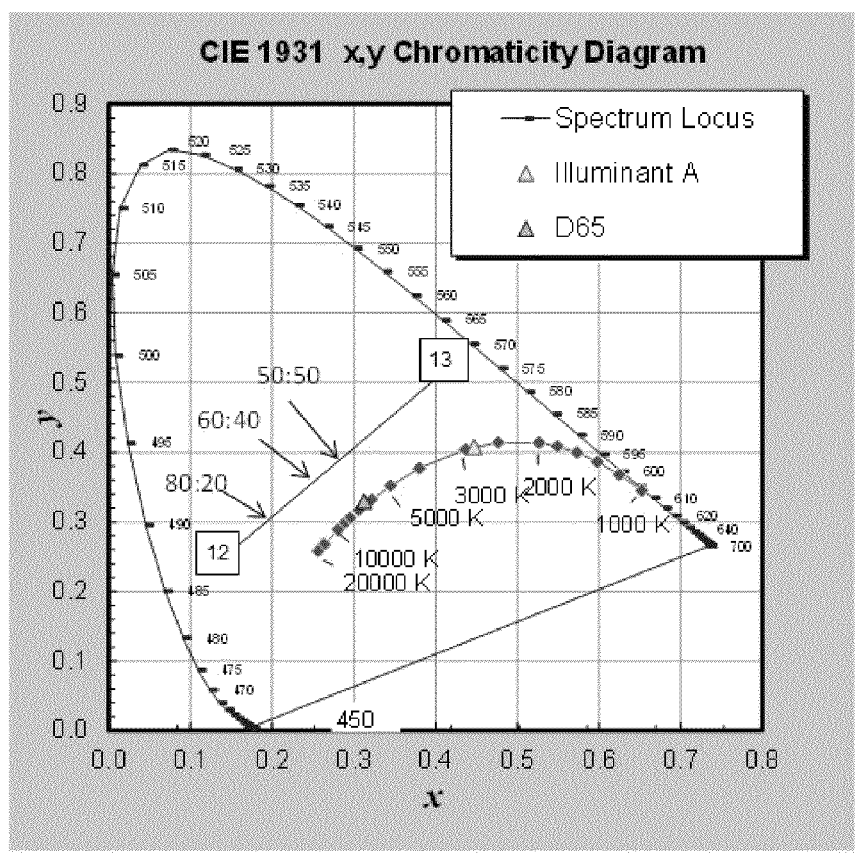
FIG. 6b shows the CIE coordinates for the mixtures of the two copper complexes 12 and 13 in accordance with the present invention.

FIG. 6 shows representative emission spectra of a single molecular phosphor according to the present embodiments (e.g., a platinum based compound). Non-limiting examples of single molecular phosphor that are capable of emitting at both the molecular and aggregate states to produce emission spectra that covers the visible region include those reported in "High efficiency single dopant white electrophosphorescent light emitting diodes," Adamovich et al., *New J. Chem.* 2002, 26, 1171-1178, and Organometallic Complexes for Optoelectronic Applications, Chapter 12.04, M. E. Thompson et al. The combination of the monomer that emits in the shorter wavelength and an excimer/dimer that emits in the longer wavelength provides a broad band that covers a large part of the visible spectrum. The emission spectrum produced span the visible spectrum so as to appear substantially white, for example, a CIE x-coordinate of about 0.3 to about 0.4 in combination with a CIE y-coordinate of about 0.3 to about 0.40. Such plot is termed as CIE chromaticity diagram (CIE=Commission International l'Eclairage), which describes the quantify the colors of OLEDs as well as CRT's and other emissive displays. The tristimules values on a two-dimensional plot, X, Y, and Z are converted to their fractional contributions (i.e., $x=X/(X+Y+Z)$, $y=Y/(X+Y+Z)$). A plot of x versus y is used to visualize how the colors are organized by the CIE system. See "OLED Efficiency and Chromaticity: Units," in Organometallic Complexes for Optoelectronic Applications, Chapter 12.04.2.2, M. E. Thompson et al.

The phosphors should have substantial absorption at the same energy as the emission of the pumping LED ($\lambda_{em}$=365-460 nm), such that, in certain embodiments, a film of 50-100 microns will absorb >99% of the incident LED illumination.

The phosphor, when excited, emits white light with a quantum efficiency of at least 40%, 50%, 60%, 70%, 80%, 90%, 95%, or 99%. Generally, the phosphor has a photoluminescent efficiency of from about 50% to about 100%, from about 60% to about 100%, or from 75% to about 100%.

The white light emission produced by the present invention may have a CRI (Color Rendering Index) of about 60 or higher, or about 80 or higher. The CRI is a measure of the quality of color light, devised by the CIE, which gives an indication of how well the light source will render colors of objects it illuminates. A perfect match of a given source to the standard illuminant gives a CRI of 100.

In certain embodiments, the phosphors may be dispersed at a molecular level. In other embodiments, the phosphors may be dispersed into a solid matrix, such as a polymer matrix. Examples of such polymers include polystyrene, polymethylmethacrylate, epoxy resins and other optical grade materials. In certain embodiments, the solid matrix includes carbazole biphenyl (CBP), and derivatives thereof, N,N'-dicarbazoloylbenzenes, and derivatives thereof, and N,N',N"-1,3,5-tricarbazoloylbenzenes, and derivatives thereof. Derivatives may include the above compounds substituted with one or more alkyl, alkenyl, alkynyl, aryl, CN, $CF_3$, $CO_2$alkyl, C(O)alkyl, N(alkyl)$_2$, $NO_2$, O-alkyl, and halo. In certain embodiments, the host matrix materials for the emissive layer include 4,4'-N,N'-dicarbazole-biphenyl (CBP), N,N'-meta-dicarbazoloylbenzene (mCP), and N,N',N"-1,3,5-tricarbazoloylbenzene (tCP). CBP has a number of important properties as a matrix material, such as, a high triplet energy of 2.56 eN (484 nm) and ambipolar charge transporting properties, that make it an excellent host for phosphorescent phosphors, and could be used as a matrix material for the present invention.

The desired color of the emitted white light of the present invention can be controlled by adjusting the mixing weight ratio (or percent weight) of the phosphors. By doing so, the emission spectrum can be determined accurately from the extinction spectra of the different phosphors and their concentrations. Such adjusting allows the same combination of phosphors to be used in producing different white light sources with differing color temperature. The correlated color temperature (CCT) characterizes color appearance of a light source, comparing its color to color of light emitted by a theoretical black body heated to high temperatures. For example, the CCT for warm white is from 2700 K to 3500 K, and the CCT for cool white is from 5000 K to 7000 K.

The percent weight of each phosphor may be independently from 10% to 90% by weight, such as from 10% to 20%, from 20% to 30%, from 30% to 40%, from 40% to 50%, from 50% to 60%, from 60% to 70%, from 70% to 80%, or from 80% to 90%, from 10% to 30%, from 20% to 40%, from 30% to 50%, from 40% to 60%, from 50% to 70%, from 60% to 80%, or from 70% to 90% of the total weight of the phosphors. For example, when the phosphor includes a first phosphor and a second phosphor, and so forth, the percent weight of the first phosphor may be from 10% to 90% and the percent weight of the second phosphor may be from 90% to 10%; and the total percent weight of the phosphor, including the first phosphor, the second phosphor and so forth, is 100% by weight of the phosphor.

Typically, the concentration for an isolation of phosphors is less than 0.1 weight percent in a solid matrix, e.g., polymer. While the concentration is low, it is sufficient that films on the order or several hundred microns may have an optical density in the UV or violet part of the spectrum of greater than 1.0. Thus, the film may efficiently collect and re-emit the light from the illuminating iLED.

EXPERIMENTAL

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

All the emission spectra were generated assuming that each emitting material has the same emission efficiency when pumped with violet light and that it does not absorb its own emission, or that of the other emitters present. Films can be prepared by suspending molecular or microcrystalline phosphors in a transparent matrix. If the materials have different emission efficiencies the amounts of each material can be adjusted to achieve the desired emission ratio.

Example 1

This example illustrates three components mixing to achieve white light downconversion.

Three iridium complexes 9, 10 and 11 are synthesized and mixed according to the emission ratio depicted in Table 1, and then dispersed in a polymer matrix. The emission efficiencies for each material were assumed to be 100% and the percentage values here correspond to the percentage of the incident light absorbed by each phosphor. Thus, the percentage corresponds to the contribution of each phosphor's emission profile to the overall emission profile. The iridium complexes absorb violet light from a UV source, and produce white light.

TABLE 1

| Mixture | Ir-complex 9 (% contribution) | Ir-complex 10 (% contribution) | Ir-complex 11 (% contribution) |
|---|---|---|---|
| a | 25 | 38 | 38 |
| b | 33 | 33 | 34 |
| c | 20 | 30 | 50 |
| d | 15 | 25 | 60 |

Figure 7A:
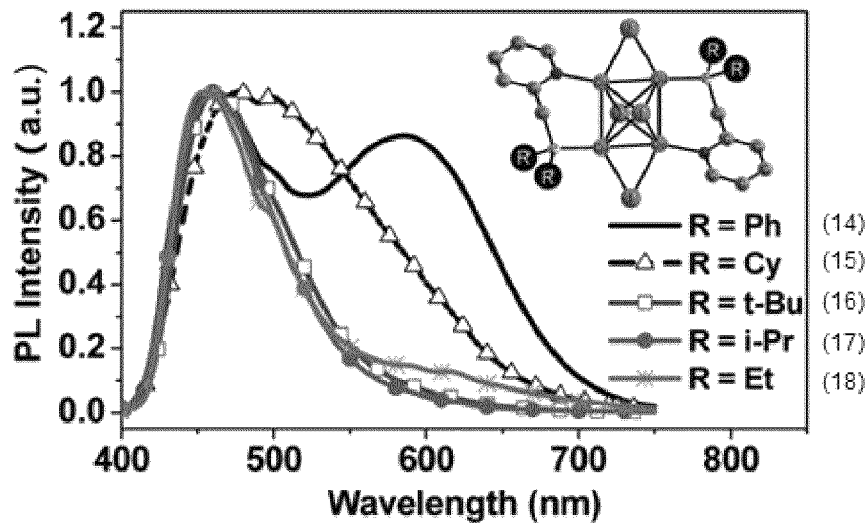
FIG. 7a shows the emission spectra of $Cu_4I_4$ clusters supported by two PΛN-type ligands 2-[(di-R-phosphino)methyl] pyridine (14, R=phenyl; 15, R=cyclohexyl; 16, R=tert-bytyl.
Figure 7B:
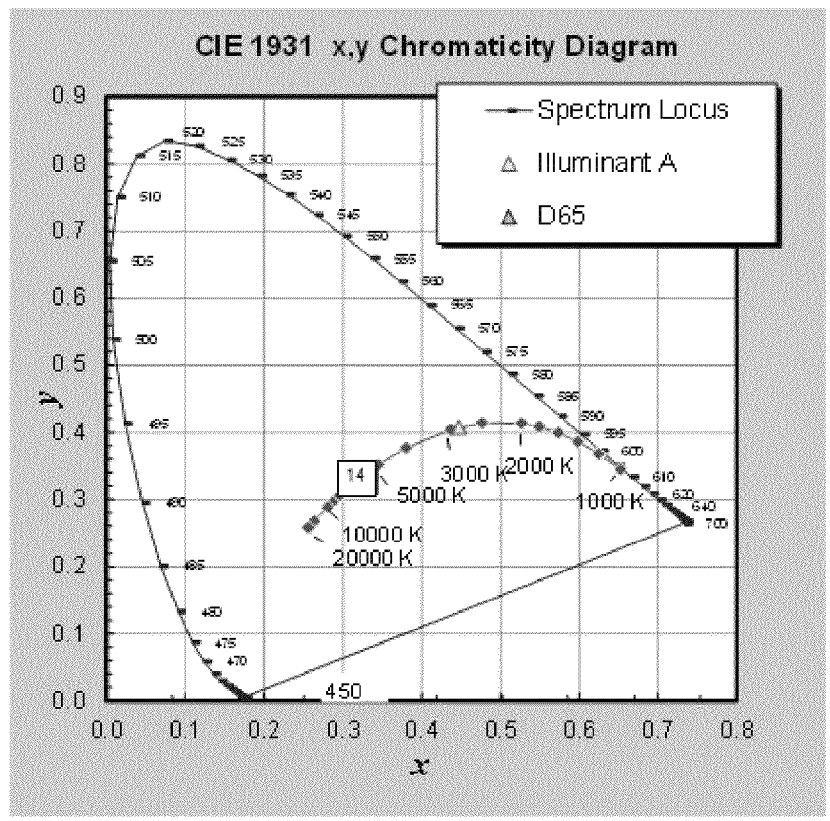
FIG. 7b shows the CIE coordinates for Cu$_4$I$_4$ cluster 14 in accordance with the present invention.

FIG. 7a shows the emission spectra of equal mixture of three iridium complexes 9, 10, and 11. FIG. 7b shows the CIE coordinates for the mixtures a, b, c and d. Illuminant A and D65 are standard illuminants.

Example 2

This example illustrates two components mixing to achieve white light downconversion.

Two copper complexes 12 and 13 are synthesized and mixed at various weight percent ratio, and then dispersed in a polymer matrix.

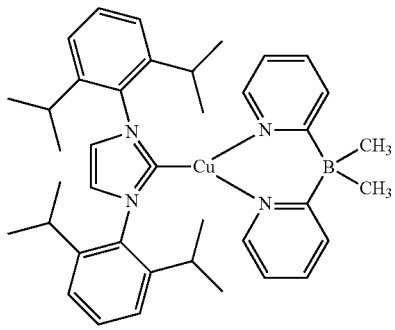

Cu-complex 12

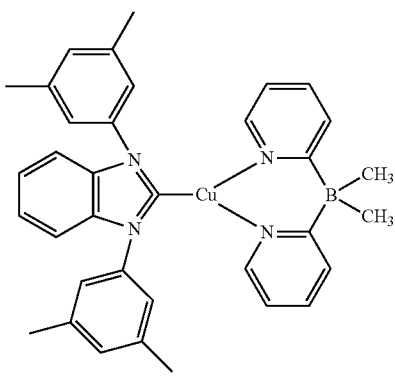

Cu-complex 13

FIG. 8a shows the emission spectra of equal mixture of two copper complexes 12, and 13 (i.e., 50:50). FIG. 8b shows the CIE coordinates for the Cu-complex 12 and Cu-complex 13. Illuminant A and D65 are standard illuminants. The mixture weight ratio of Cu-complex 13:Cu-complex 12 of 50:50. 60:40, and 80:20 are shown in the CIE chromaticity diagram. Mixing Cu-complexes 12 and 13 gives any color along the line joining their coordinates. Cu-complexes 12 and 13 emit blue and yellow colors respectively, and were chosen for illustration purposes. Replacement of the yellow emitter with a red emitting material may allow one to access the black body locus.

Example 3

This example illustrates a single component mixing to achieve white light downconversion.

Single phosphors $Cu_4I_4$ clusters supported by two PΛN-type ligands 2-[(di-R-phosphino)methyl]pyridine (14, R=phenyl; 15, R=cyclohexyl; 16, R=tert-bytyl; 17, R=isopropyl; 18, R=ethyl) were synthesized according to procedures described in "$Cu_4I_4$ Clusters Supported by PΛN-type Ligands: New Structures with Tunable Emission Colors;" Zhiwei Liu, Peter I. Djurovich, Matthew T. Whited, and Mark E. Thompson, *Inorganic Chemistry*, 2012, 51, 230-236, which is incorporated herein by reference in its entirely.

Emission spectra of these $Cu_4I_4$ clusters are shown in FIG. 9a. FIG. 9b shows the CIE coordinates for the $Cu_4I_4$ cluster 14). Illuminant A and D65 are standard illuminants.

The invention claimed is:

1. A white light emitting device comprising an emissive layer having a thickness of from about 100 microns to about 1000 microns, wherein the emissive layer comprises a phosphorescent phosphor for energy downconversion to generate a broadband light spectrum, wherein the phosphor absorbs light at a first wavelength $\lambda_1$ of radiation, and emits light of different emission wavelengths having lower energies than the first wavelength $\lambda_1$.

2. The white light emitting device of claim 1, wherein the phosphor when excited emits white light with a quantum efficiency of at least 40%.

3. The white light emitting device of claim 1, wherein the phosphor when excited emits white light with a quantum efficiency of at least 50%.

4. The white light emitting device of claim 1, wherein the phosphor has a photoluminescent efficiency of from about 50% to about 100%.

5. The white light emitting device of claim 1, wherein the first wavelength $\lambda_1$ is in the range of 300 nm and 450 nm.

6. The white light emitting device of claim 1, wherein the phosphor emits from a triplet states upon absorption of light at the first wavelength $\lambda_1$.

7. The white light emitting device of claim 1, wherein the phosphor comprises two or more phosphors.

8. The white light emitting device of claim 1, wherein the phosphor comprises a first phosphor and a second phosphor.

9. The white light emitting device of claim 8, wherein the first phosphor emits light in a wavelength range of 400 nm to 540 nm.

10. The white light emitting device of claim 8, wherein the second phosphor emits light in a wavelength range of 520 nm to 700 nm.

11. The white light emitting device of claim 8, wherein the first phosphor is present in a percent weight of from 10% to 90% and the second phosphor is present in a percent weight of from 90% to 10%.

12. The white light emitting device of claim 8, wherein the phosphor further comprises a third phosphor.

13. The white light emitting device of claim 12, wherein the third phosphor emits light in a wavelength range of 500 nm to 600 nm.

14. The white light emitting device of claim 1, wherein the phosphor is dispersed at the molecular level in a solid, crystalline or microcrystalline matrix, and further wherein the matrix comprises a polymer.

15. The white light emitting device of claim 1, wherein the phosphor comprises a phosphorescent metal complex.

16. The white light emitting device of claim 1, wherein the phosphor comprises a phosphorescent organometallic iridium complex.

17. The white light emitting device of claim 1, wherein the emissive layer has an optical density of greater than 1.0 absorbance unit in a wavelength range of from 300 nm to 450 nm.

18. A white light emitting device comprising an emissive layer, wherein the emissive layer comprises a phosphorescent phosphor for energy downconversion to generate a broadband light spectrum, wherein the phosphor absorbs light at a first wavelength $\lambda_1$ of radiation, and emits light of different emission wavelengths having lower energies than the first wavelength $\lambda_1$, wherein the phosphor comprises a single phosphor that emits simultaneously from molecular and aggregate states.

19. The white light emitting device of claim 18, wherein the single phosphor emits light from the molecular state in a wavelength range of blue and/or green.

20. The white light emitting device of claim 18, wherein the single phosphor emits light from the aggregate state in a wavelength range of orange.

21. A white light emitting device comprising an emissive layer, wherein the emissive layer comprises a phosphorescent phosphor for energy downconversion to generate a broadband light spectrum, wherein the phosphor absorbs light at a first wavelength $\lambda_1$ of radiation, and emits light of different emission wavelengths having lower energies than the first wavelength $\lambda_1$, wherein the phosphor does not absorb the emitted light by the phosphor.

22. A white light emitting device comprising an emissive layer, wherein the emissive layer comprises a phosphorescent phosphor for energy downconversion to generate a broadband light spectrum, wherein the phosphor absorbs light at a first wavelength $\lambda_1$ of radiation, and emits light of different emission wavelengths having lower energies than the first wavelength $\lambda_1$, wherein the phosphor is dispersed at the molecular level in a solid, crystalline or microcrystalline matrix, and further wherein the phosphor is present at a concentration of less than 0.1 weight percent based on the total weight of the matrix.

23. A white light emitting device comprising an emissive layer, wherein the emissive layer comprises a phosphorescent phosphor for energy downconversion to generate a broadband light spectrum, wherein the phosphor absorbs light at a first wavelength $\lambda_1$ of radiation, and emits light of different emission wavelengths having lower energies than the first wavelength $\lambda_1$, wherein the phosphor comprises a phosphorescent organometallic copper complex.

24. A white light emitting device comprising an emissive layer having a thickness of from about 100 microns to about 1000 microns, wherein the emissive layer comprises a phosphorescent phosphor for energy downconversion to generate a broadband light spectrum, wherein the phosphor absorbs light at a first wavelength $\lambda_1$ of radiation from an excitation source in the blue, violet, or ultra violet region, and emits light of different emission wavelengths having lower energies than the first wavelength $\lambda_1$; wherein the phosphorescent comprises a copper complex, iridium compound or mixtures thereof.

25. A method of generating white light comprising:
providing an excitation source;
providing a molecular phosphorescent phosphor for absorbing a UV light source at a first wavelength $\lambda_1$ of radiation; and
emitting light of different emission wavelengths having lower energies than the first wavelength $\lambda_1$; wherein the phosphor does not absorb the emitted light by the phosphor.

* * * * *